US011222686B1

(12) United States Patent
Noguchi

(10) Patent No.: US 11,222,686 B1
(45) Date of Patent: Jan. 11, 2022

(54) APPARATUSES AND METHODS FOR CONTROLLING REFRESH TIMING

(71) Applicant: MICRON TECHNOLOGY, INC., Boise, ID (US)

(72) Inventor: Hidekazu Noguchi, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/095,978

(22) Filed: Nov. 12, 2020

(51) Int. Cl.
*G11C 11/406* (2006.01)
*G11C 7/06* (2006.01)
*G11C 7/10* (2006.01)
*G11C 11/4076* (2006.01)

(52) U.S. Cl.
CPC ........ *G11C 11/40615* (2013.01); *G11C 7/065* (2013.01); *G11C 7/1036* (2013.01); *G11C 11/4076* (2013.01); *G11C 11/40622* (2013.01)

(58) Field of Classification Search
CPC .................. G11C 7/065; G11C 7/1036; G11C 11/40615; G11C 11/40622; G11C 11/4076
USPC ........................................................ 365/222
See application file for complete search history.

(56) References Cited

U.S. PATENT DOCUMENTS

| 5,299,159 | A | 3/1994 | Balistreri et al. |
|---|---|---|---|
| 5,654,929 | A | 8/1997 | Mote, Jr. |
| 5,699,297 | A | 12/1997 | Yamazaki et al. |
| 5,933,377 | A | 8/1999 | Hidaka |
| 5,943,283 | A | 8/1999 | Wong et al. |
| 5,956,288 | A | 9/1999 | Bermingham et al. |
| 5,959,923 | A | 9/1999 | Matteson et al. |
| 5,970,507 | A | 10/1999 | Kato et al. |
| 5,999,471 | A | 12/1999 | Choi |
| 6,002,629 | A | 12/1999 | Kim et al. |
| 6,011,734 | A | 1/2000 | Pappert |
| 6,061,290 | A | 5/2000 | Shirley |
| 6,212,118 | B1 | 4/2001 | Fujita |

(Continued)

FOREIGN PATENT DOCUMENTS

| CN | 101038785 A | 9/2007 |
|---|---|---|
| CN | 101067972 A | 11/2007 |

(Continued)

OTHER PUBLICATIONS

U.S. Appl. No. 16/997,766 titled "Refresh Logic Circuit Layouts Thereof" filed Aug. 19, 2020, pp. all.

(Continued)

*Primary Examiner* — Son L Mai
(74) *Attorney, Agent, or Firm* — Dorsey & Whitney LLP

(57) ABSTRACT

Refresh commands may be provided at random intervals from a memory controller to a memory device. In some examples, refresh requests may be provided at random intervals which may be used to provide refresh commands from the memory controller to the memory device at random intervals. In some examples, an average time interval between refresh requests may be equal to a refresh interval of the memory device. In some examples, a maximum number of times the memory controller may postpone providing a refresh command to the memory device may be a random number. In some examples, a maximum value of the random number may be based, at least in part, on a minimum number of refresh commands required within a time interval by the memory device.

20 Claims, 7 Drawing Sheets

(56) References Cited

U.S. PATENT DOCUMENTS

| | | |
|---|---|---|
| 6,306,721 B1 | 10/2001 | Teo et al. |
| 6,310,806 B1 | 10/2001 | Higashi et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Done et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 * | 5/2018 | Seo ......................... G11C 7/00 |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |

(56) References Cited

U.S. PATENT DOCUMENTS

| | | |
|---|---|---|
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0008799 A1 | 1/2007 | Dono et al. |
| 2007/0014175 A1 | 1/2007 | Min et al. |
| 2007/0092651 A1 | 1/2007 | Lee |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0092508 A1 | 4/2015 | Bains |
| 2015/0109871 A1 | 4/2015 | Bains et al. |
| 2015/0134897 A1 | 5/2015 | Sriramagiri et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |

(56) References Cited

U.S. PATENT DOCUMENTS

| | | |
|---|---|---|
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0348100 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |

FOREIGN PATENT DOCUMENTS

| | | |
|---|---|---|
| CN | 104350546 A | 2/2015 |
| CN | 106710621 A | 5/2017 |
| CN | 107871516 A | 4/2018 |
| JP | 2005-216429 A | 8/2005 |
| JP | 2011-258259 | 12/2011 |
| JP | 2011-258259 A | 12/2011 |
| JP | 4911510 B2 | 1/2012 |
| JP | 2013-004158 A | 1/2013 |
| JP | 6281030 B1 | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |

(56) References Cited

FOREIGN PATENT DOCUMENTS

| WO | 2020247163 A1 | 12/2020 |
|----|---------------|---------|
| WO | 2020247639 A1 | 12/2020 |

OTHER PUBLICATIONS

U.S. Appl. No. 17/175,485 titled "Apparatuses and Methods for Distributed Targeted Refresh Operations" filed Feb. 12, 2021; pp. all.
U.S. Appl. No. 17/186,913 titled "Apparatuses and Methods for Dynamic Refresh Allocation" filed Feb. 26, 2021, pp. all.
U.S. Appl. No. 17/187,002 titled "Apparatuses and Methods for Staggered Timing of Targeted Refresh Operations" filed Feb. 26, 2021, pp. all.
U.S. Appl. No. 16/797,658, titles "Apparatuses and Methods for Controlling Refresh Operations", filed Feb. 21, 2020; pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020; pp. all.
U.S. Appl. No. 16/232,837, titled "Apparatuses and Methods for Distributed Targeted Refresh Operations", filed Dec. 26, 2018; pp. all.
U.S. Appl. No. 16/818,989, titled "Semiconductor Device Performing Row Hammer Refresh Operation", dated Mar. 13, 2020, pp. all.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed Feb. 26, 2019; pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284 titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed Apr. 4, 2019; pp. all.
International Application No. PCT/US19/40169 titled "Apparatus and Methods for Triggering Row Hammer Address Sampling" filed Jul. 1, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
International Application No. PCT/US20/32931, titled "Apparatuses and Methods for Controlling Steal Rates", dated May 14, 2020, pp. all.
U.S. Appl. No. 16/546,152 titled "Apparatuses and Methods for Analog Row Access Tracking" filed Aug. 20, 2019, pp. all.
U.S. Appl. No. 16/548,027 titled "Apparatuses, Systems, and Methods for Analog Row Access Rate Determination" filed Aug. 22, 2019, pp. all.

U.S. Appl. No. 16/549,942 titled "Apparatuses and Methods for Lossy Row Access Counting" filed Aug. 23, 2019, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses and Methods for Tracking All Row Accesses" filed May 29, 2019, pp. all.
U.S. Appl. No. 16/427,105 titled "Apparatuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 16/513,400 titled "Apparatuses and Methods for Tracking Row Accesses" filed Jul. 16, 2019, pp. all.
U.S. Appl. No. 16/537,981 titled "Apparatuses and Methods for Controlling Targeted Refresh Rates" filed Aug. 12, 2019, pp. all.
U.S. Appl. No. 16/655,110 titled "Apparatuses and Methods for Dynamic Targeted Refresh Steals" filed Oct. 16, 2019, pp. all.
U.S. Appl. No. 17/008,396 titled "Apparatuses and Methods for Staggered Timing of Targeted Refresh Operations" filed Aug. 31, 2020, pp. all.
U.S. Appl. No. 15/789,897, entitled "Apparatus and Methods for Refreshing Memory", filed Oct. 20, 2017; pp. all.
U.S. Appl. No. 15/796,340, entitled "Apparatus and Methods for Refreshing Memory", filed Oct. 20, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/411,573 titled "Apparatuses, Systems, and Methods for a Content Addressable Memory Cell" filed May 14, 2019, pp. all.
U.S. Appl. No. 16/411,698 title "Semiconductor Device" filed May 14, 2019,pp. all.
U.S. Appl. No. 16/427,330 titled "Apparatuses and Methods for Storing Victim Row Data" filed May 30, 2019, pp. all.
U.S. Appl. No. 16/428,625 titled "Apparatuses and Methods for Tracking Victim Rows" filed May 31, 2019, pp. all.
U.S. Appl. No. 16/431,641 titled "Apparatuses and Methods for Controlling Steal Rates" filed Jun. 4, 2019, pp. all.
U.S. Appl. No. 16/549,411 titled "Apparatuses and Methods for Dynamic Refresh Allocation" filed Aug. 23, 2019, pp. all.
U.S. Appl. No. 16/682,606, titled "Apparatuses and Methods for Distributing Row Hammer Refresh Events Across a Memory Device", filed Nov. 13, 2019, pp. all.
U.S. Appl. No. 15/876,566, titled 'Apparatuses and Methods for Calculating Row Hammer Refresh Addresses in a Semiconductor Device' filed Jan. 22, 2018, pp. all.

(56) References Cited

OTHER PUBLICATIONS

U.S. Appl. No. 15/656,084, titled: Apparatuses and Methods for Targeted Refreshing of Memory, filed Jul. 21, 2017, pp. all.

International Application No. PCT/US18/55821 "Apparatus and Methods for Refreshing Memory" filed Oct. 15, 2018, pp. all.

U.S. Appl. No. 15/715,846, entitled "Semiconductor Device", filed Sep. 26, 2017, pp. all.

U.S. Appl. No. 15/888,993, entitled "Apparatuses and Methods for Controlling Refresh Operations", filed Feb. 5, 2018, pp. all.

U.S. Appl. No. 16/190,627 titled "Apparatuses and Methods for Targeted Refreshing of Memory" filed Nov. 14, 2018, pp. all.

U.S. Appl. No. 16/459,520 titled "Apparatuses and Methods for Monitoring Word Line Accesses", filed Jul. 1, 2019, pp. all.

U.S. Appl. No. 17/030,018, titled "Apparatuses and Methods for Controlling Refresh Operations", filed Sep. 23, 2020, pp. all.

U.S. Appl. No. 15/281,818, entitled: "Semiconductor Device" filed Sep. 30, 2016, pp. all.

Kim, et al., "Flipping Bits in MemoryWithout Accessing Them: An Experimental Study of DRAM Disturbance Errors", IEEE, Jun. 2014, 12 pgs.

U.S. Appl. No. 16/994,338 titled "Apparatuses, Systems, and Methods for Memory Directed Access Pause" filed Aug. 14, 2020, pp. all.

U.S. Appl. No. 16/997,659 titled "Apparatuses, Systems, and Methods for Refresh Modes" filed Aug. 19, 2020; pp. all.

U.S. Appl. No. 17/127,654 titled "Apparatuses and Methods for Row Hammer Based Cache Lockdown" filed Dec. 18, 2020, pp. all.

U.S. Appl. No. 17/324,621 titled "Apparatuses and Methods for Pure-Time, Self-Adopt Sampling for Row Hammer Refresh Sampling" filed May 19, 2021.

U.S. Appl. No. 17/347,957 titled "Apparatuses and Methods for Controlling Steal Rates" filed Jun. 15, 2021.

U.S. Appl. No. 16/432,604 titled "Apparatuses and Methods for Staggered Timing of Skipped Refresh Operations" filed Jun. 5, 2019, pp. all.

U.S. Appl. No. 17/226,975 titled "Apparatuses and Methods for Staggered Timing of Skipped Refresh Operations" filed Apr. 9, 2021, pp. all.

\* cited by examiner

APPARATUSES AND METHODS FOR CONTROLLING REFRESH TIMING

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto refresh operation.

Due to the high frequency of accesses of memory cells, it is often unfeasible to track the addresses provided with every access command (e.g., read, write) in order to identify the memory cells affected by a row hammer. Memory devices may use one or more techniques for sampling the addresses provided with access commands. However, sampling techniques run the risk of missing aggressor rows, particularly if an attacker has been able to determine the sampling pattern and circumvent it. Accordingly, less discernable sampling techniques may be desirable.

DETAILED DESCRIPTION

The following description of certain embodiments is merely exemplary in nature and is in no way intended to limit the scope of the disclosure or its applications or uses.

In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines), and the memory cells may be refreshed on a row-by-row basis. In order to prevent information from being lost or corrupted due to this decay, the memory may carry out refresh operations. During a refresh operation, information may be rewritten to the word line to restore its initial state. Auto refresh operations may be performed on the word lines of the memory in a sequence such that over time each of the word lines of the memory are refreshed at a rate faster than the expected rate of data degradation.

Figure 1A:
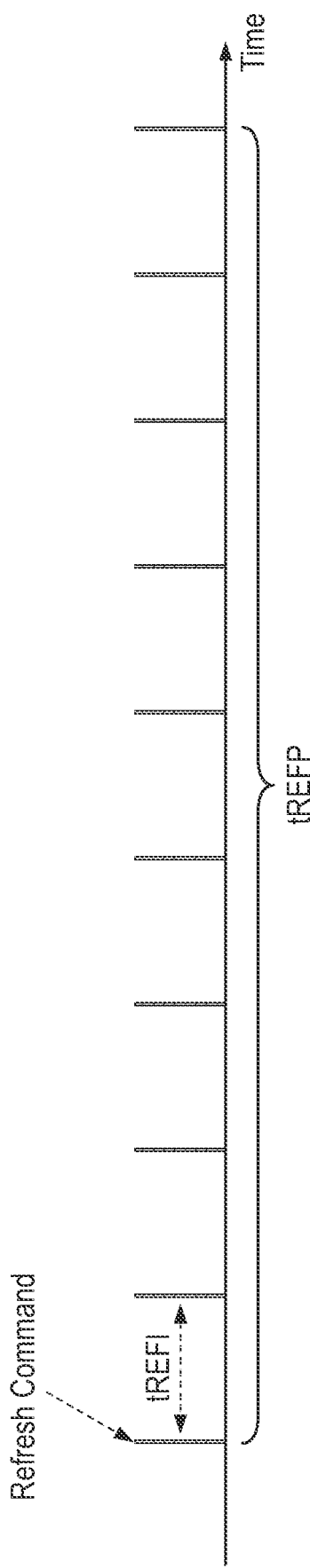
FIG. 1A is a timing diagram illustrating refresh commands provided by a memory controller to a memory device.

FIG. 1A is a timing diagram illustrating refresh commands provided by a memory controller to a memory device. Refresh operations performed by a memory device may be performed responsive to refresh commands received from a memory controller in communication with the memory device. Generally, timing of refresh operations performed by a memory device is specified by a refresh interval time (tREFI). In some applications, tREFI may be based on a data retention characteristic of the memory device (e.g., an expected rate of data degradation of memory cells). The parameter tREFI may be indicated by a specification of the memory device and/or a standard (e.g., JEDEC) in some applications. An example of tREFI is 7.8 microseconds, but tREFI is not limited to this particular value. The memory controller may provide refresh at regular intervals, e.g., every tREFI, to cause the memory device to perform refresh operations.

The memory controller may include internal circuitry that manages the timing of the refresh commands provided to the memory device. For example, the circuitry may receive a clock signal and include a counter that counts a number of clock cycles until tREFI has elapsed. Each time tREFI elapses, the internal circuitry may activate a signal which indicates a refresh command may be issued by the memory controller.

The memory controller may provide other non-refresh commands to the memory device, such as access commands (e.g., read, write). During some periods of time, the memory controller may issue many non-refresh commands to the memory device. These periods of time may be referred to as times when the memory controller is "busy." When the memory controller is busy, it may postpone sending refresh commands to the memory device so that the memory device will perform the access operations indicated by the access commands without stopping to perform refresh operations. This may reduce read and/or write delays in some applications.

Some memory devices may permit postponement of refresh operations for a certain period of time. For example, a memory device may not require that refresh commands be provided at regular intervals but that a certain number of refresh commands be provided within a certain period of time specified by a refresh period (tREFP). In some applications, the number of refresh commands and/or tREFP may be based on a data retention characteristic of the memory device (e.g., an expected rate of data degradation of memory cells). The number of refresh commands and/or the refresh period may be defined by the specification of the memory device and/or a standard in some applications. For example, the number of refresh commands may be ten, and the tREFP may be tREFI×9, but the number of refresh commands and tREFI are not limited to these particular values. Thus, one or more refresh commands may be postponed and issued at intervals shorter than tREFI at a later time to maintain the number of refresh commands within tREFP. The memory controller may include internal circuitry that keeps track of how many times providing a refresh command is postponed. The internal circuitry may cause the memory controller to issue one or more refresh commands when the maximum number of postponements is reached.

Figure 1B:
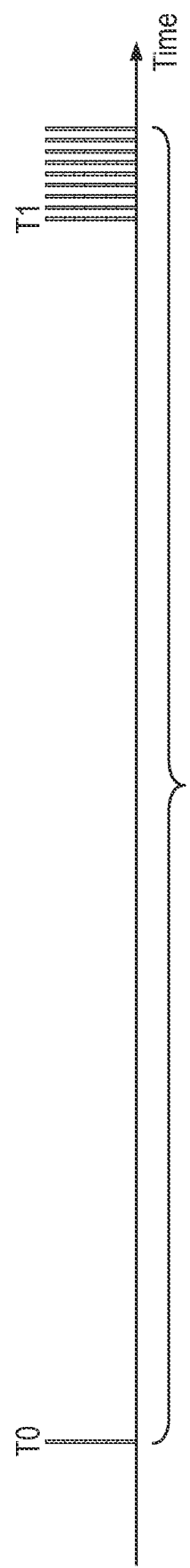
FIG. 1B is a timing diagram illustrating refresh commands provided by a memory controller to a memory device.

FIG. 1B is a timing diagram illustrating refresh commands provided by a memory controller to a memory device. In this example, the memory device may require ten refresh commands within a tREFP of tREFI×9. A memory controller may provide a refresh command at a beginning of tREFP at or around time T0. After issuing the refresh command, the memory controller may enter a busy period and postpone providing additional refresh commands until at our around time T1 at which the memory controller may provide nine refresh commands in quick succession (e.g., the commands may be separated by a minimum required delay between commands) to provide a total of ten refresh commands within tREFP. In this example, the memory controller may postpone providing a refresh command for up to eight tREFI. The example shown in FIG. 1B may be the most extreme postponement case in some applications, and different lengths of postponement and timing between the postponed refresh commands may vary in other examples.

When access commands are provided, the memory controller may provide memory addresses (e.g., row addresses) associated with the access commands. The memory device may provide access to a portion of a memory array of the memory device indicated by the memory address provided with the access command. For example, the memory device may activate and provide data stored at the address to the memory controller responsive to a read command. Certain patterns or manners of accessing the memory may cause adverse effects to data stored in the memory. For example, repeated access to a particular row of memory (e.g., an aggressor row) may cause an increased rate of decay in rows (e.g., victim rows) which are close to the aggressor row. These repeated accesses may be part of a deliberate attack against the memory and/or may be due to 'natural' access patterns of the memory. The increased rate of decay in the victim rows may require that they be refreshed as part of a targeted refresh operation.

It is often unfeasible to track the row addresses provided with every access command, and memory devices may use one or more techniques for sampling the row addresses accessed. For example, the memory device may sample one or more row addresses received after a refresh command is received and/or have a sample timing based on a timing of the refresh command. However, sampling techniques run the risk of missing aggressor rows, particularly if an attacker has been able to determine the sampling pattern and circumvent it.

Figure 2A:
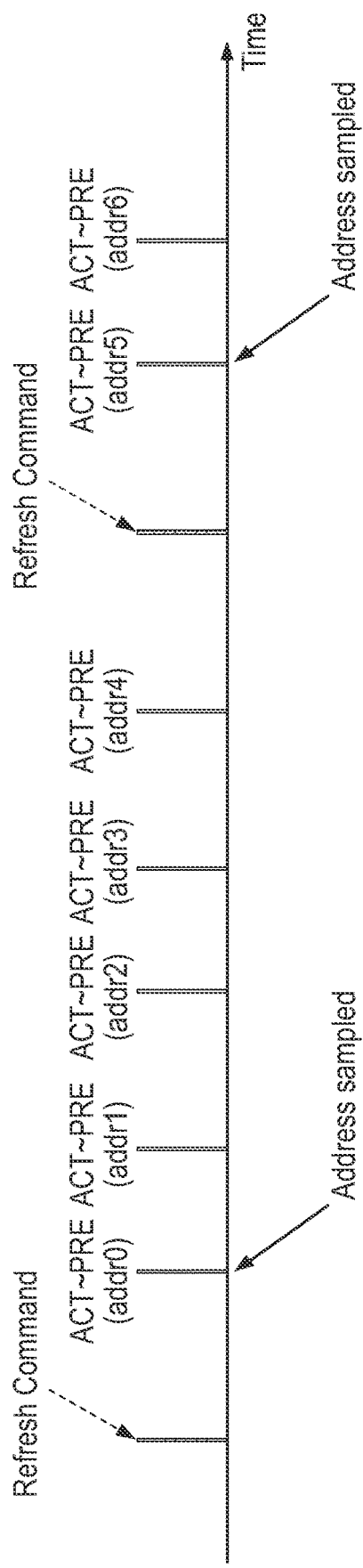
FIG. 2A is a timing diagram illustrating commands and addresses provided by a memory controller to a memory device.

FIG. 2A is a timing diagram illustrating commands and addresses provided by a memory controller to a memory device. In the example shown, the memory controller may provide a refresh command followed by a series of access and precharge commands (ACT~PRE) with associated addresses (addr0-4). Another refresh command may be provided followed by additional access commands and addresses. Although all of the access commands shown are activation commands ACT followed by precharge commands PRE, in other examples, other or additional commands may be provided in other examples.

As part of a technique for ameliorating the effects of repeated accesses, the memory device may latch the first address provided by the memory controller after the refresh command. In the example shown in FIG. 2A, the memory device may sample (e.g., latch) addresses addr0 and addr5. In some memory devices, if a same row address is repeatedly sampled after the refresh commands, the memory device may identify the row address as associated with an aggressor row and perform a targeted refresh address on victim rows to reduce the risk of data degradation on the victim rows. However, basing the sampling of row addresses on the refresh command may leave the memory device vulnerable to undetected aggressor rows.

Refresh timing is controlled by the memory controller, however, a program running on a computing system including the memory controller and the memory device may be able to manipulate the refresh timing in some cases. For example, the program may be designed to reduce access commands provided to the memory device by the controller. When access commands are low, the refresh commands may be provided at regular intervals as shown in FIG. 1B. The program may then infer the timing of the refresh commands and provide addresses in a manner that defeats the sampling mechanism of the memory device.

Figure 2B:
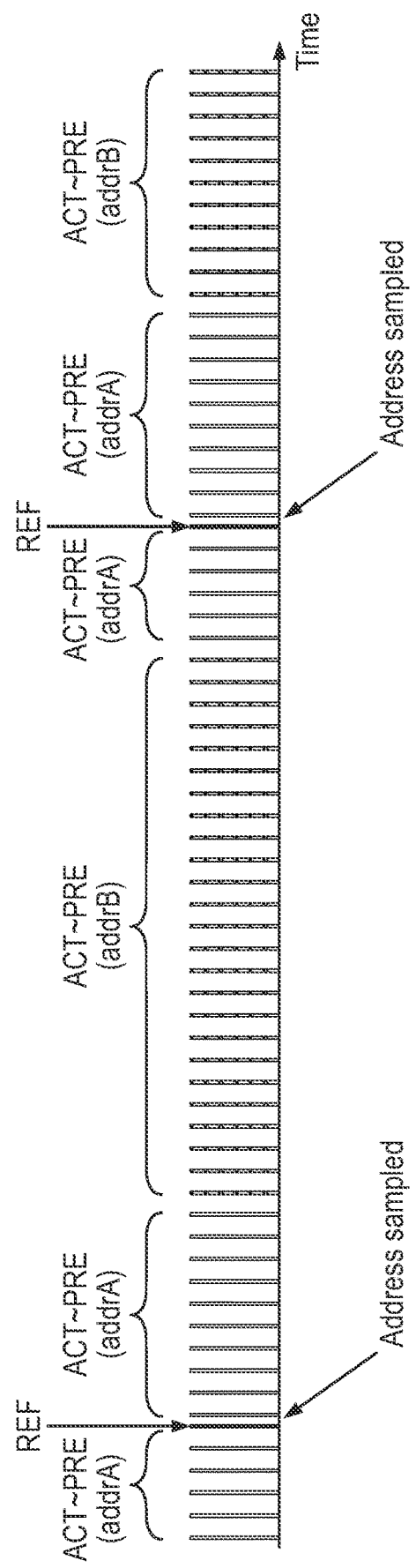
FIG. 2B is a timing diagram illustrating addresses received and sampled by a memory device.

FIG. 2B is a timing diagram illustrating addresses received and sampled by a memory device. In this example, two row addresses, addrA and addrB are repeatedly accessed based on addresses and associated access commands provided by a memory controller. The access commands and addresses may be based on requests made by a program running on a computing system including the memory device and the memory controller. A refresh command REF is also periodically issued by the memory controller. Responsive to the refresh command REF, the memory device may perform a refresh operation and sample a next address provided by the memory controller after the refresh command. As shown in FIG. 2B, although both addresses addrA and addrB are provided, only addrA is sampled due to the sequence of addresses provided and timing of the refresh commands. The memory device may determine a row associated with addrA is an aggressor row whereas the row associated with addrB may be the "true" aggressor row. Thus, the memory device may perform targeted refresh operations on the victim rows of the row associated with addrA, and the victim rows of the row associated with addrB may be vulnerable to data degradation because addrB was undetected by the sampling mechanism. Accordingly, reducing the vulnerabilities of memory devices that use refresh command timing to control sample timing may be desirable.

The present disclosure is drawn to apparatuses, systems, and methods for providing refresh commands to a memory device at random intervals. As used herein, random is used to encompass not only purely random processes, but also near-random, pseudo-random, and semi-random processes. In some embodiments, a refresh request circuit of a memory controller may provide refresh requests to a command generator of the memory controller at random intervals instead of regularly at tREFI. An average length of the random intervals may be equal to tREFI in some embodiments. In some embodiments, a refresh request circuit of a memory controller may randomly change a maximum number of postponements of refresh commands by the memory controller. By randomizing tREFI and/or a maximum number of postponements, the issuing of refresh commands by the memory controller may be randomized. This may reduce or eliminate the ability to determine when a refresh command will be issued by the memory controller, and in turn when an address will be sampled by the memory device. This may reduce or eliminate the ability to provide "decoy" addresses to the memory device to prevent the memory device from detecting an aggressor row.

Figure 3:
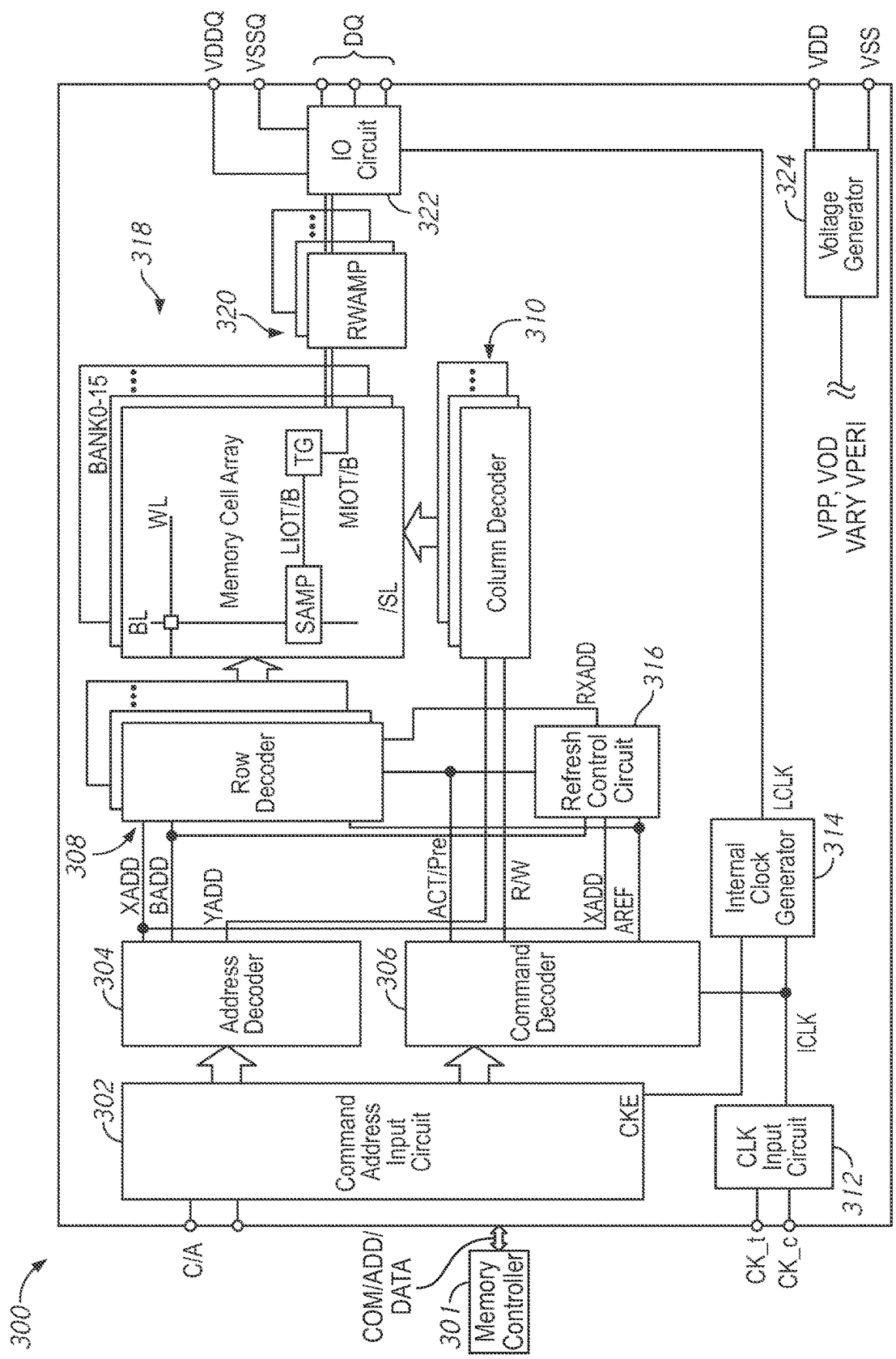
FIG. 3 is a block diagram of a semiconductor device according to an embodiment of the present disclosure.

FIG. 3 is a block diagram of a semiconductor device according to an embodiment of the disclosure. The semiconductor device 300 may be a semiconductor memory device, such as a DRAM device integrated on a single semiconductor chip.

The semiconductor device 300 includes a memory array 318. The memory array 318 is shown as including a plurality of memory banks. In the embodiment of FIG. 3, the memory array 318 is shown as including sixteen memory banks BANK0-BANK15. More or fewer banks may be included in the memory array 318 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder circuit 308 and the selection of the bit lines BL and/BL is performed by a column decoder circuit 310. In the embodiment of FIG. 3, the row decoder circuit 308 includes a respective row decoder circuit for each memory bank and the column decoder circuit 310 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 320 over complementary local data lines (LIOT/B), transfer gate (TG), and complementary main data lines (MIOT/B). Conversely, write data outputted from the read/write amplifiers 320 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 300 may employ a plurality of external terminals that include command and address (C/A) terminals coupled to a command and address bus to receive commands and addresses, and a CS signal, clock terminals to receive clocks CK_t and CK_c, data terminals DQ to provide data, and power supply terminals to receive power supply potentials VDD, VSS, VDDQ, and VSSQ.

The clock terminals are supplied with external clocks CK_t and CK_c that are provided to an input circuit 312. The external clocks may be complementary. The input circuit 312 generates an internal clock ICLK based on the CK_t and CK_c clocks. The ICLK clock is provided to the command decoder circuit 310 and to an internal clock generator 314. The internal clock generator 314 provides various internal clocks LCLK based on the ICLK clock. The LCLK clocks may be used for timing operation of various internal circuits. The internal data clocks LCLK are provided to the input/output circuit 322 to time operation of circuits included in the input/output circuit 322, for example, to data receivers to time the receipt of write data.

The C/A terminals may be supplied with memory addresses. The memory addresses supplied to the C/A terminals are transferred, via a command/address input circuit 302, to an address decoder 304. The address decoder 304 receives the address and supplies a decoded row address XADD to the row decoder circuit 308 and supplies a decoded column address YADD to the column decoder circuit 310. The address decoder 304 may also supply a decoded bank address BADD, which may indicate the bank of the memory array 318 containing the decoded row address XADD and column address YADD. The C/A terminals may be supplied with commands. Examples of commands include access commands for accessing the memory, such as commands for performing read operations and commands for performing write operations. The access commands may be associated with one or more of a row address XADD, column address YADD, and/or bank address BADD to indicate the memory cell(s) to be accessed. In some embodiments, the commands and/or addresses may be provided by a component external to the device 300, for example, as shown in FIG. 3, a memory controller 301 in communication with the device 300.

The commands may be provided as internal command signals to a command decoder circuit 306 via the command/address input circuit 302. The command decoder circuit 306 includes circuits to decode the internal command signals to generate various internal signals and commands for performing operations. For example, the command decoder circuit 306 may provide a row command signal to select a word line and a column command signal to select a bit line.

The device 300 may receive access commands for performing read operations. When the commands are received, and a bank address, a row address and a column address are timely supplied with the commands, read data is read from memory cells in the memory array 318 corresponding to the row address and column address. The commands are received by the command decoder circuit 306, which provides internal commands so that read data from the memory array 318 is provided to the read/write amplifiers 320. The read data is output to outside from the data terminals DQ via the input/output circuit 322.

The device 300 may receive access commands for performing write operations. When the commands are received, and a bank address, a row address and a column address are timely supplied with the commands, write data supplied to the data terminals DQ is written to a memory cells in the memory array 318 corresponding to the row address and column address. The commands are received by the command decoder circuit 106, which provides internal commands so that the write data is received by data receivers in the input/output circuit 322. Write clocks may also be provided to the external clock terminals for timing the receipt of the write data by the data receivers of the input/output circuit 322. The write data is supplied via the input/output circuit 322 to the read/write amplifiers 320, and by the read/write amplifiers 320 to the memory array 318 to be written into the memory cell MC.

The device 300 may also receive commands from the memory controller 301 causing it to carry out one or more refresh operations as part of a self-refresh mode. The device 300 may be periodically placed in a refresh mode. Thus, refresh operations may be performed periodically each time the memory device is in the refresh mode. In some embodiments, when an external signal indicates a refresh mode entry command (e.g., an external refresh command), the refresh signal AREF may also be activated. The refresh signal AREF may be a pulse signal which is activated when the command decoder circuit 306 receives a signal which indicates entry to the self-refresh mode. The refresh signal AREF may be activated once immediately after command input, and thereafter may be cyclically activated at desired internal timing. The refresh signal AREF may be used to control the timing of refresh operations during the refresh mode. A self-refresh exit command may cause the automatic activation of the refresh signal AREF to stop and may cause the device 300 to return to an idle state and/or resume other operations.

As used herein, an activation of a signal may refer to any portion of a signal's waveform to which that a circuit responds. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The refresh signal AREF is supplied to the refresh control circuit 316. The refresh control circuit 316 supplies a refresh row address RXADD to the row decoder circuit 308, which may refresh one or more word lines WL indicated by the refresh row address RXADD. The refresh control circuit 316 may control a timing of the refresh operation, and may generate and provide the refresh address RXADD. The refresh control circuit 316 may be controlled to change details of the refreshing address RXADD (e.g., how the refresh address is calculated, the timing of the refresh addresses, the number of word lines represented by the address), for example, by control signals provided by command decoder circuit 306, or may operate based on internal logic.

The refresh control circuit 316 may selectively output a targeted refresh address (e.g., which specifies one or more victim address based on an aggressor) or an automatic refresh address (e.g., from a sequence of auto refresh addresses) as the refresh address RXADD. Based on the type of refresh address RXADD, the row decoder circuit 308 may perform a targeted refresh or auto refresh operation. The automatic refresh addresses may be from a sequence of addresses which are provided based on activations of the refresh signal AREF. The refresh control circuit 316 may cycle through the sequence of auto refresh addresses at a rate determined by AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

The refresh control circuit 316 may also determine targeted refresh addresses which are addresses that require refreshing (e.g., victim addresses corresponding to victim rows) based on the access pattern of nearby addresses (e.g., aggressor addresses corresponding to aggressor rows) in the memory array 318. The refresh control circuit 316 may use one or more signals of the device 300 to calculate the targeted refresh address. For example, the refresh address RXADD may be a calculated based on the row addresses XADD provided by the address decoder 304.

According to embodiments of the present disclosure, the refresh control circuit 316 may calculate one or more victim addresses. The victim addresses may correspond to victim rows have varying spatial relationships to the aggressor row. For example, the victim addresses may correspond to victim rows directly adjacent to the aggressor row (+/−1) or victim rows more spatially distant from the aggressor row (e.g., +/−2). The calculated victim row addresses may be used as targeted refresh addresses provided as RXADD during targeted refresh operations.

In some embodiments, after a refresh command is received from the memory controller 301, the refresh control circuit 316 may sample a value of the next row address XADD provided by the address decoder 304 along a row address bus. The refresh control circuit 316 may determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses. In other embodiments, other techniques for determining the aggressor addresses.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The refresh control circuit 316 may use some criteria to judge whether an address is an aggressor address, which may capture potential aggressor addresses rather than definitively determining which addresses are causing data degradation in nearby victims. For example, the refresh control circuit 316 may determine potential aggressor addresses based on a pattern of accesses to the addresses and this criteria may include some addresses which are not aggressors, and miss some addresses which are. Similar victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. During the periodic refresh operations of a refresh mode, the refresh control circuit 316 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 316 may determine whether to provide a targeted refresh address, not provide an address during that time slot, or provide an auto refresh address instead during the time slot.

The power supply terminals are supplied with power supply potentials VDD and VSS. The power supply potentials VDD and VSS are supplied to an internal voltage generator circuit 324. The internal voltage generator circuit 324 generates various internal potentials VPP, VOD, VARY, VPERI, and the like based on the power supply potentials VDD and VSS supplied to the power supply terminals. The internal potential VPP is mainly used in the row decoder circuit 308, the internal potentials VOD and VARY are mainly used in the sense amplifiers SAMP included in the memory array 318, and the internal potential VPERI is used in many peripheral circuit blocks.

The power supply terminals are also supplied with power supply potentials VDDQ and VSSQ. The power supply potentials VDDQ and VSSQ are supplied to the input/output circuit 322. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 322 so that power supply noise generated by the input/output circuit 322 does not propagate to the other circuit blocks.

In some embodiments, the memory controller 301 may be in communication with a processor, such as a central processing unit of a computing system (not shown). In other embodiments, the memory controller 301 may be integrated with the processor. The memory controller 301 may provide commands COM and/or addresses ADD to the C/A terminals of the device 300 and provide and receive data DATA via the DQ terminals of the device 300. In some embodiments, some of the commands and/or addresses provided by the memory controller 301 may be based on instructions provided by the processor. Some of the instructions provided by the processor may be based, at in part, on a program being executed by the processor (e.g., executable instructions stored on a non-transitory computer readable medium accessible to the processor, not shown). Some of the commands provided by the memory controller 301 may be generated internally by circuitry of the memory controller 301. For example, the memory controller 301 may include internal circuitry for controlling when refresh commands are provided to the device 300.

As will be described in more detail with reference to the following figures, according to embodiments of the present disclosure, the memory controller 301 may provide refresh commands to the device 300 at random time intervals. However, the random time intervals may remain within the operating margin of the device 300 such that refresh operations are performed at a rate higher than an expected rate of data degradation of the memory cells of the device 300. For example, in some embodiments, the memory controller 301 may include internal circuitry that generates refresh command requests at random time intervals. The memory controller 301 may provide refresh commands to the device 300 based, at least in part, on the randomly generated refresh command requests. In some embodiments, an average length of time of the random intervals may be tREFI of the device 300.

When the memory controller 301 receives instructions from the processor to access the memory array 318 of the device 300, the memory controller 301 may postpone one or more refresh commands, despite the refresh command requests, to provide access commands based on the instructions from the processor. According to embodiments of the present disclosure, a number of times that the memory controller 301 may postpone providing the refresh command to the device 300 may be random. In some embodiments, a maximum value of the random number may be based, at least in part, on tREFP of the device 300.

In some applications, randomizing when refresh requests are generated and/or how long issuing a refresh command may be postponed may make it more difficult to determine when refresh commands will be provided by the memory controller 301 to the device 300. This may make it more difficult to determine when the device 300 will sample XADD to detect aggressor rows. Accordingly, this may make it more difficult to circumvent the sampling of row addresses performed by the device 300 to mitigate row hammer and/or other memory attacks.

Figure 4:
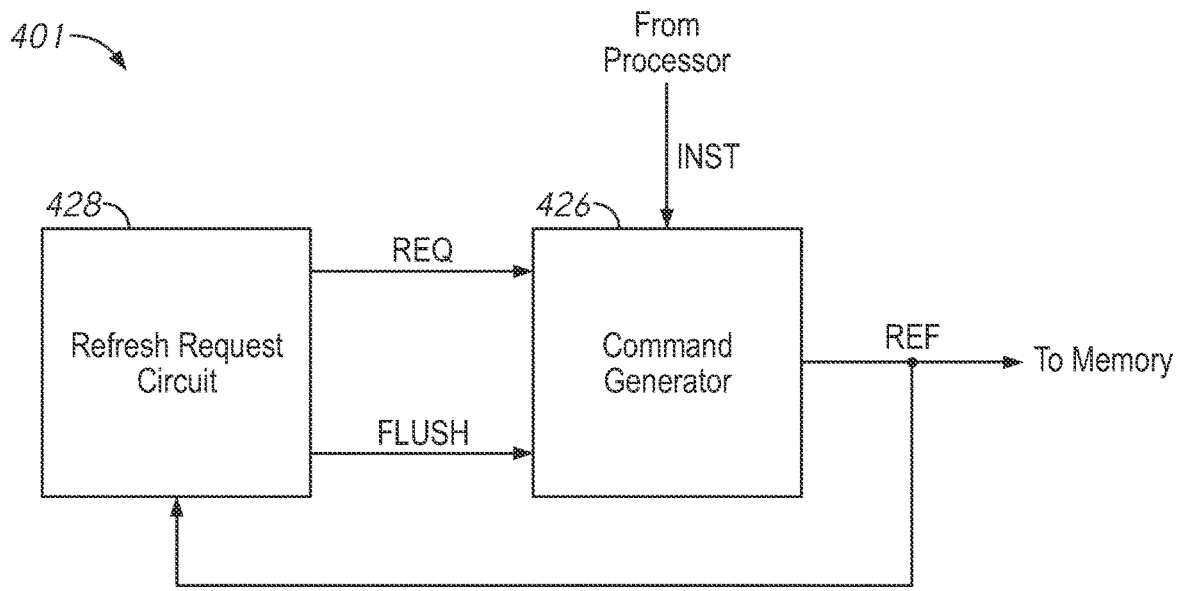
FIG. 4 is a block diagram of a portion of a memory controller according to an embodiment of the disclosure.

FIG. 4 is a block diagram of a portion of a memory controller according to an embodiment of the disclosure. The memory controller 401 may be included in memory controller 301 in some embodiments. The memory controller 401 may be used to provide refresh commands to a memory device, such as device 300, at random time intervals. Providing the refresh commands at random intervals may randomize (or further randomize) when the memory device samples a row address provided by the memory controller 401 with a subsequent access command in some applications. The memory controller 401 may include a command generator 426 and a refresh request circuit 428.

The command generator 426 may generate and provide commands to a memory device, such as device 300. One or more of the commands may be generated based on instructions INST received from a processor (not shown). One or more commands may be generated based on one or more signals provided by circuitry included with the memory controller 401, for example, refresh request circuit 428. In some embodiments, the refresh request circuit 428 may randomly vary the timing of refresh requests and/or a number of times providing refresh commands may be postponed in order to randomize when refresh commands are issued by the command generator 426.

The refresh request circuit 428 may generate refresh requests REQ at random intervals and provide the refresh requests REQ to the command generator 426. In some embodiments, generating refresh requests may include temporarily activating a refresh request signal (e.g., generating a square pulse). The random intervals may have an average length of time equal to tREFI of the memory device in some embodiments. In some embodiments, when the command generator 426 has not received instructions INST from the processor to access the memory device and/or is not generating and/or providing commands based on INST to the memory device (e.g., is not busy), the command generator 426 may provide a refresh command REF to the memory device responsive to the refresh request REQ. In some embodiments, when the command generator 426 has received instructions INST from the processor to access the memory device and/or is generating and/or providing commands based on INST to the memory device (e.g., is busy), the command generator 426 may postpone issuing the refresh command REF responsive to the refresh request REQ provided by the refresh request circuit 428.

The refresh request circuit 428 may keep track of a number of refresh requests REQ provided to the command generator 426 and a number of refresh commands REF provided by the command generator 426. When a difference between the number of refresh requests REQ and the number of refresh commands REF reaches a threshold value (e.g., equals or exceeds the threshold value), the refresh request circuit 428 may issue a flush signal FLUSH. Responsive to the flush signal, the command generator 426 may provide a number of refresh commands REF such that the difference between the number of refresh requests REQ and refresh commands REF is zero. In other words, when the command generator 426 has postponed providing a refresh command REF for a maximum length of time, the refresh request circuit 428 may cause the command generator 426 to issue a number of refresh commands REF such that a desired number of refresh commands REF are provided within tREFP of the memory device. In some embodiments, the command generator 426 may pause generating and/or providing commands based on instructions INST provided from the processor until all refresh commands REF are issued responsive to the FLUSH signal.

In some embodiments, the threshold value may vary randomly over time. For example, each time the FLUSH signal is issued, the threshold value may be set to a new random number. In some embodiments, the threshold value may have a natural number value including and between one and a maximum value. In some embodiments, the maximum value may be based on a minimum number of refresh commands REF required within tREFP by the memory device to prevent data degradation.

Figure 5:
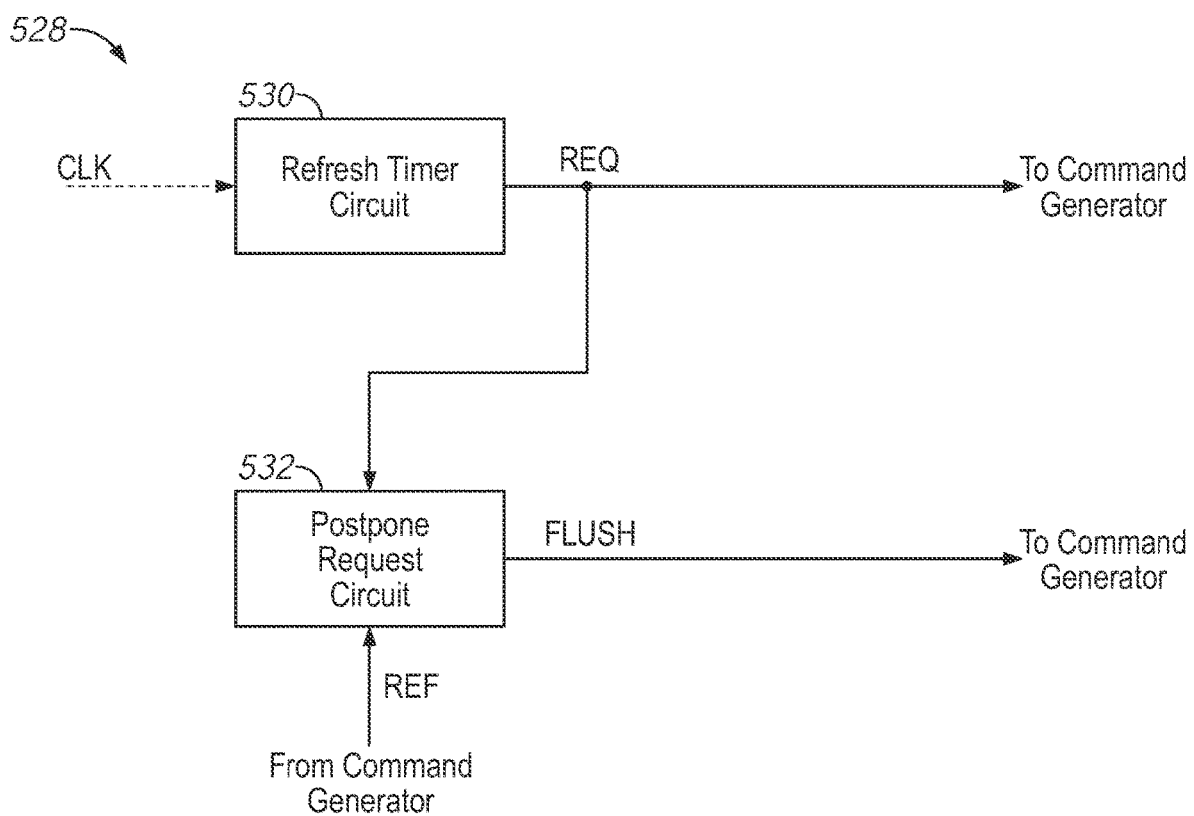
FIG. 5 is a block diagram of at least a portion of a refresh request circuit according to an embodiment of the disclosure.

FIG. 5 is a block diagram of at least a portion of a refresh request circuit according to an embodiment of the disclosure. The refresh request circuit 528 may be included in refresh request circuit 428 in some embodiments. The refresh request circuit 528 may include a refresh timer circuit 530 and a postpone request circuit 532.

The refresh timer circuit 530 may provide refresh requests REQ to a command generator circuit, such as command generator 426. The refresh timer circuit 530 may measure an interval of time and provide the refresh request REQ each time the interval of time has elapsed. A length of the interval of time may be random. In some embodiments, an average length of time of the intervals may be equal to tREF. In some embodiments, the refresh timer circuit 530 may receive a clock signal CLK and count a number of clock cycles to determine when the interval of time has elapsed. The clock signal CLK may be provided by a system clock included with a memory controller (e.g., memory controller 301 and/or 401), a processor (not shown), and/or other clock included in a computing system that includes the refresh timer circuit 530. In other embodiments, the refresh timer circuit 530 may include an internal clock for generating the clock signal CLK.

The refresh request circuit 528 may further include a postpone request circuit 532. The postpone request circuit 532 may receive the refresh request REQ from the refresh timer circuit 530 and the refresh command REF from the command generator. The postpone request circuit 532 may count a number of refresh requests REQ and refresh commands REF provided. When the refresh requests REQ received outnumber the refresh commands REF by a threshold value (e.g., the difference between REQ and REF equals or exceeds a threshold value), the postpone request circuit 532 may provide a flush FLUSH signal to the command generator. In some embodiments, the threshold value may be a random number. A maximum threshold value may be selected such that the command generator will provide a number of refresh commands to the memory device that meets a minimum number of refresh commands required within a given time period for proper operation of the memory device.

Figure 6:
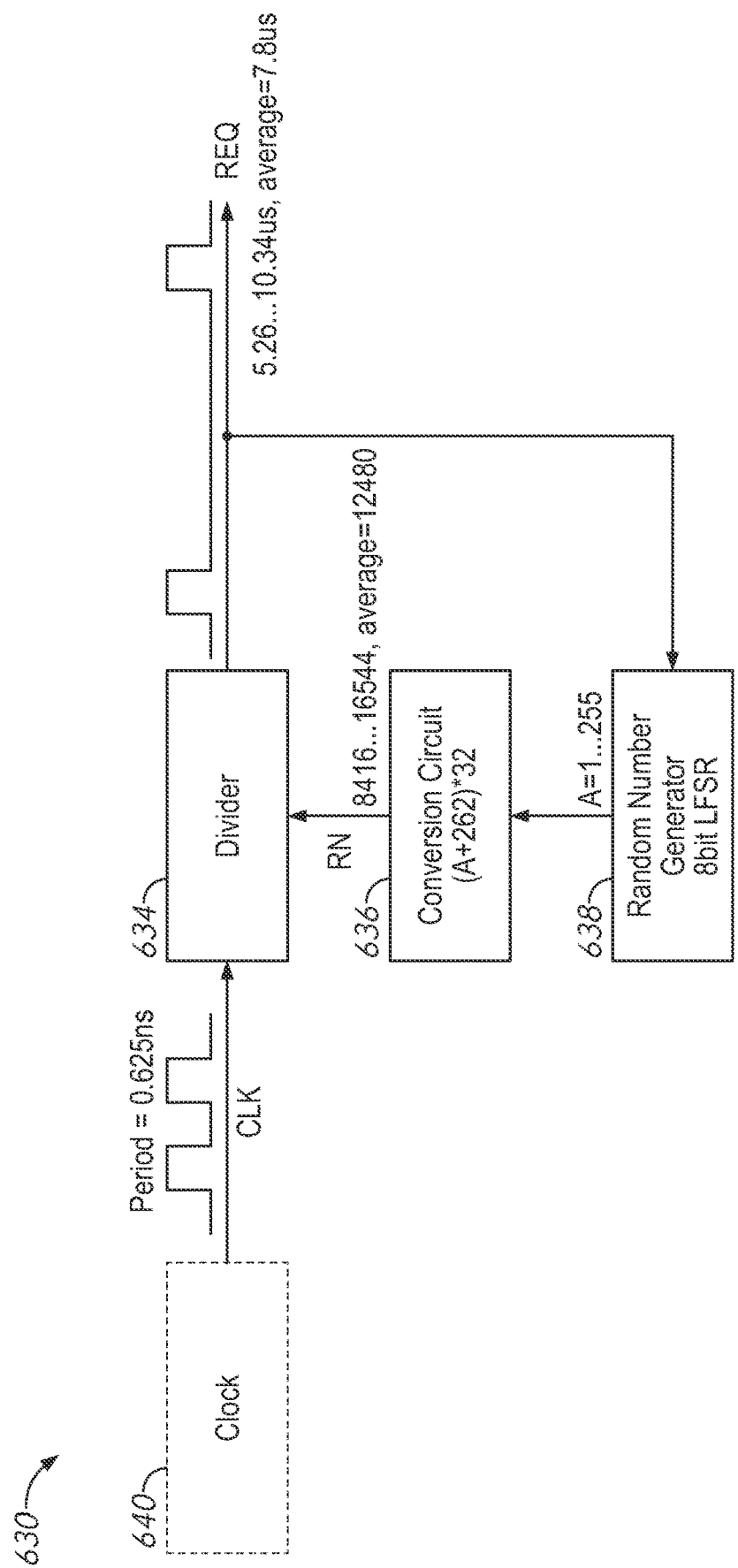
FIG. 6 is a block diagram of an example refresh timer circuit according to an embodiment of the disclosure.

FIG. 6 is a block diagram of an example refresh timer circuit according to an embodiment of the disclosure. The refresh timer circuit 630 may be used to implement refresh timer circuit 530 in some embodiments to provide refresh requests REQ at random intervals. The refresh timer circuit 630 may include a divider circuit 634, a conversion circuit 636, and a random number generator 638.

The divider circuit 634 may receive a clock signal CLK from a clock 640. The clock 640 may either be a clock included with the refresh timer circuit 630 and/or an external clock (e.g., a system clock). The divider circuit 634 may divide a frequency of the clock signal CLK based, at least in part, on a random number RN and output the refresh requests REQ. As shown in FIG. 6, the refresh requests REQ may be active high pulses (e.g., square waves) separated by random intervals of time. The refresh requests REQ may be provided to a command generator of a memory controller, such as command generator 426.

The random number RN may be based, at least in part, on a random number A provided by random number generator 638. Various circuits may be used to implement the random number generator 638. For example, an eight bit linear feedback shift register (LFSR) may be used to generate the random number A to output a random number from 1 to 255 in some embodiments. The random number generator 638 may receive the refresh request REQ and output a new random number A each time a refresh request REQ is received.

In some embodiments, the random intervals between the refresh requests REQ may be equal to tREFI. In some of these embodiments, an arithmetic conversion may be performed in the random number A to generate the desired average interval by a conversion circuit 636. For example, when tREFI=7.8 us, the period of CLK is 0.625 ns, and the random number generator 638 is an 8-bit LFSR, the conversion circuit 636 may add 262 to the random number A and multiply the sum by 32 to generate random number RN having an average of 12,480, which when used by divider circuit 634 to divide CLK, results in an average interval between refresh requests REQ equal to 7.8 us. The numbers provided are only examples, and the disclosure is not limited to the particular values of CLK, A, RN, and tREFI provided. If different techniques are used to generate the random number A, the conversion circuit 636 may perform different arithmetic operations to generate random number RN to achieve the desired average time period between refresh requests REQ in other embodiments. Furthermore, in some embodiments, other techniques may be used by the random number generator 638 to generate the random number that results in a number than may be used by the divider circuit 634 directly to achieve the desired average time between refresh requests REQ. In these embodiments, the conversion circuit 636 may be omitted.

Figure 7:
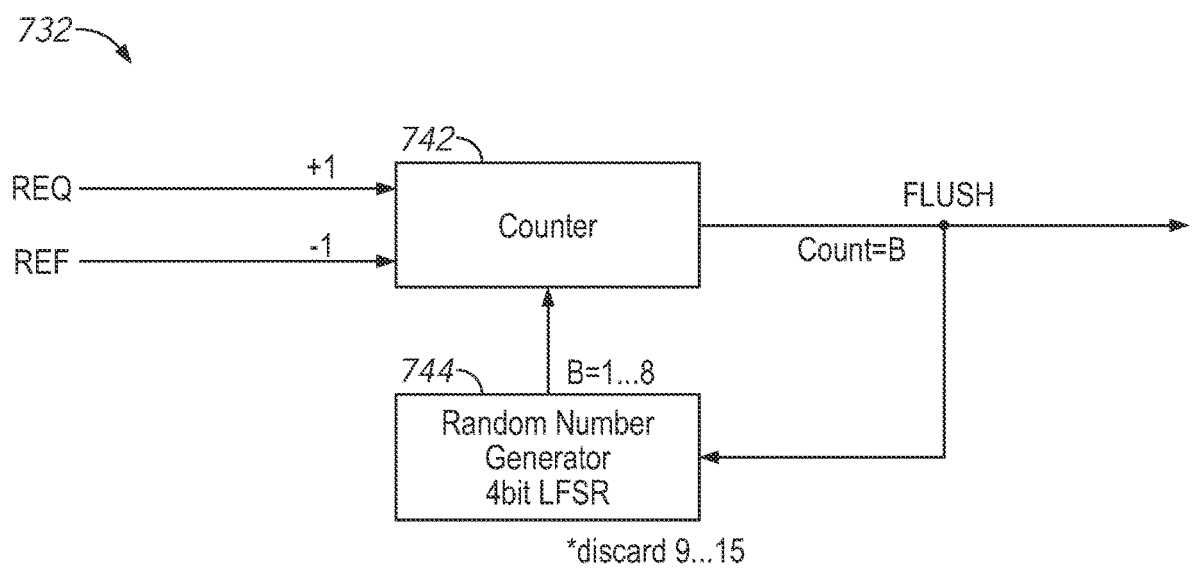
FIG. 7 is a block diagram of an example postpone request circuit according to an embodiment of the disclosure.

FIG. 7 is a block diagram of an example postpone request circuit according to an embodiment of the disclosure. The postpone request circuit 732 may be used to implement postpone request circuit 532 in some embodiments to randomize a number of times providing a refresh command may be postponed. The postpone request circuit 732 may include a counter circuit 742 and a random number generator 744.

In some embodiments, such as the one shown in FIG. 7, the counter circuit 742 may be an up/down counter circuit. The counter circuit 742 may receive refresh requests REQ from a refresh request timer (e.g., refresh timer 630 and/or refresh timer 530) and refresh commands REF from a command generator (e.g., command generator 426). Each time a refresh request REQ is received, the counter circuit 742 may increment a count value stored therein. Each time a refresh command REF is received, the counter circuit 742 may decrement the count value stored therein. If the command generator postpones issuing refresh commands REF responsive to the refresh requests REQ, the value of the counter circuit 742 may continue to increment as the refresh requests REQ are provided at regular and/or random intervals. Once the count value reaches a threshold value (e.g., equals or exceeds the threshold value), the counter circuit 742 may provide the flush signal FLUSH. In some embodiments, FLUSH may include the count value Count, which may be equal to the threshold value. This may cause the command generator to issue a number of refresh commands equal to the value of Count. In other embodiments, the FLUSH signal may provide one of two logic state (e.g., low/high) and be temporarily activated (e.g., a pulse) rather than provide a numerical value. In these embodiments, the Count may be sent as a separate signal. In embodiments where FLUSH includes the Count value, FLUSH may have a value equal to zero until the count value of the counter circuit 742 equals the threshold value.

In some embodiments, the threshold value may be based, at least in part, on a random number B provided by a random number generator 744. Various circuits may be used to implement the random number generator 744. In some embodiments, an LFSR, such as a 4-bit LFSR may be included in the random number generator 744. In some embodiments, the random number generator 744 may receive the FLUSH signal and generate a new random number responsive to the FLUSH signal (e.g., when FLUSH is non-zero value). The random number B may have a value equal to a whole number including and between one and a maximum value. The maximum value of the random number B may be based, at least in part, on a minimum number of refresh commands required within tREFP of a memory device in communication with a memory controller including the postpone request circuit 732. In some embodiments, techniques to generate random numbers within the desired range may be used. In other embodiments, techniques to generate random numbers may be used that generate numbers outside the range, but random numbers outside the range are discarded and new random numbers are generated until one is generated within the range. For example, if the minimum number of refresh commands required within tREFP is nine, and a 4-bit LFSR is used to implement the random number generator 744, numbers generated above eight may be discarded in some embodiments.

The apparatuses, systems, and methods disclosed herein may allow refresh commands to be provided from a memory controller to a memory device at random intervals, for example, by randomizing a timing of refresh requests and/or a maximum number of postponements of refresh commands. This may reduce or eliminate the ability to determine when a refresh command will be issued by the memory controller, and in turn when an address will be sampled by the memory device.

Figure 8:
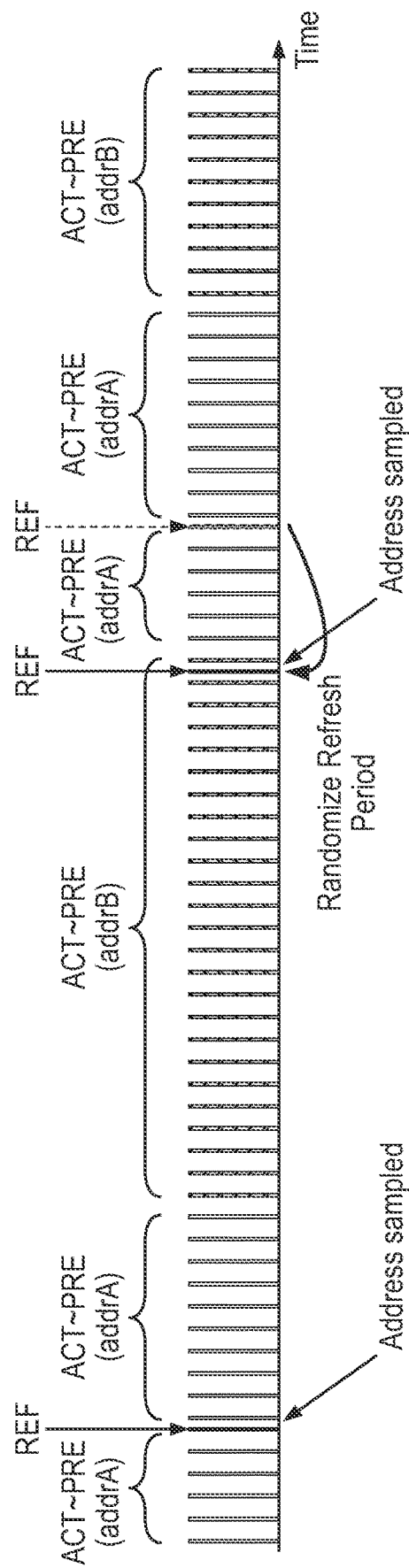
FIG. 8 is a timing diagram illustrating addresses received and sampled by a memory device according to an embodiment of the disclosure.

FIG. 8 is a timing diagram illustrating addresses received and sampled by a memory device according to an embodiment of the disclosure. Similar to FIG. 2B, in the illustrated example, two row addresses, addrA and addrB are repeatedly accessed in a memory (e.g., device 300) based on addresses and associated access commands provided by a memory controller (e.g., memory controller 301 and/or 401). The access commands and addresses may be based, for example, at least in part, on requests made by a program running on a computing system including the memory device and the memory controller. A refresh command REF is issued by the memory controller. Responsive to the refresh command REF, the memory device may perform a refresh operation and sample a next address provided by the memory controller after the refresh command. However, in contrast to the example shown in FIG. 2B, the refresh commands are not periodically issued, but are instead issued at random intervals. In this example, the second refresh command REF is issued sooner than a non-random refresh command REF (shown in dashed lines in FIG. 8). As a result, addrA is sampled responsive to the first refresh command REF and addrB is sampled responsive to the second refresh command REF. Thus, both row addresses addrA and addrB are captured rather than only addrA as shown in FIG. 2B. In some applications, the memory device may more accurately determine which of addrA and/or addrB is an aggressor row. Accordingly, vulnerabilities of memory devices that use refresh command timing to control sample timing may be reduced by the systems, methods, and apparatuses disclosed herein.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a refresh request circuit configured to provide a refresh request when a time interval has elapsed, wherein a length of the time interval is random; and
a command generator configured to provide a refresh command to a memory device based, at least in part, on the refresh request.

2. The apparatus of claim 1, wherein and an average of the length of the time interval is a refresh interval of the memory device.

3. The apparatus of claim 2, wherein the refresh interval of the memory is based, at least in part, on a data retention characteristic of the memory device.

4. The apparatus of claim 1, wherein the refresh request circuit is further configured to count a number of refresh requests provided and a number of refresh commands provided, wherein the refresh request circuit is configured to provide an active flush signal when the number of refresh requests provided equals or exceeds the number of refresh commands provided by a threshold value, wherein the threshold value is a random number.

5. The apparatus of claim 1, wherein the refresh request circuit comprises a linear feedback shift register (LFSR) configured to provide an output, wherein the length of the time interval is based, at least in part, on the output.

6. The apparatus of claim 5, wherein the refresh request circuit further comprises a clock divider circuit configured to receive a clock signal and divide the clock signal by a value to provide the refresh request when the time interval has passed, wherein the value is based on the output of the LFSR.

7. The apparatus of claim 1, further comprising the memory device, wherein the memory device is configured to latch a row address when the refresh command is received.

8. An apparatus comprising:
a refresh request circuit configured to provide a plurality of refresh requests at a corresponding plurality of time intervals; and
a command generator configured to provide a plurality of refresh commands to a memory based, at least in part, on the plurality of refresh requests,
wherein the refresh request circuit is configured to count a number of the plurality of refresh requests provided and a number of the plurality of refresh commands provided, and the refresh request circuit is further configured to provide an active flush signal when the number of refresh requests provided equals or exceeds the number of refresh commands provided by a threshold value, wherein the threshold value is a random number, and
wherein the command generator is configured to provide a number of refresh commands equal to the threshold value when the active flush signal is provided.

9. The apparatus of claim 8, wherein the refresh request circuit comprises a linear feedback shift register configured to provide the random number.

10. The apparatus of claim 8, wherein the refresh request circuit comprises a counter circuit configured to increase a count value when the refresh request is provided and decrease the count value when the refresh command is provided and the counter circuit provides the active flush signal when the count value equals the threshold value.

11. The apparatus of claim 8, wherein each of the plurality of time intervals comprises a random amount of time.

12. The apparatus of claim 11, wherein the plurality of time intervals have an average amount of time equal to a refresh interval of the memory.

13. The apparatus of claim 8, wherein the random number has an integer value equal to or between one and a maximum value, wherein the maximum value is based, at least in part, on a data retention characteristic of the memory.

14. The apparatus of claim 8, further comprising the memory configured to latch a plurality of row addresses responsive to corresponding ones of the refresh commands.

15. The apparatus of claim 14, wherein the memory is further configured to determine an aggressor row based, at least in part, on the plurality of row addresses and refresh a victim row of the aggressor row.

16. A method comprising:
providing a plurality of refresh requests at corresponding ones of a plurality of time intervals, wherein each of the plurality of time intervals is a random length of time; and
providing a plurality of refresh commands to a memory, responsive, at least in part, to the plurality of refresh requests.

17. The method of claim 16, further comprising postponing at least one of the plurality of refresh commands until a threshold value is reached, wherein the threshold value equals a number of the plurality of refresh requests provided and a number of the plurality of refresh commands provided.

18. The method of claim 17, wherein the threshold value is a random number.

19. The method of claim 16, wherein the random length of time is generated, at least in part, by a linear feedback shift register.

20. The method of claim 16, wherein an average length of time of the plurality of time intervals is equal to a refresh interval of the memory.

* * * * *